(12) United States Patent
McCalmont

(10) Patent No.: US 6,903,569 B2
(45) Date of Patent: Jun. 7, 2005

(54) INPUT TERMINAL WITH COMBINED LOGIC THRESHOLD AND RESET FUNCTION

(75) Inventor: Jonathan S. McCalmont, Ames, IA (US)

(73) Assignee: Micrel, Inc., San Jose, CA (US)

( * ) Notice: Subject to any disclaimer, the term of this patent is extended or adjusted under 35 U.S.C. 154(b) by 94 days.

(21) Appl. No.: 10/654,337

(22) Filed: Sep. 2, 2003

(65) Prior Publication Data
US 2005/0046443 A1 Mar. 3, 2005

(51) Int. Cl.[7] .............................................. H03K 19/003
(52) U.S. Cl. .............................. 326/31; 326/33; 326/62; 326/80
(58) Field of Search ........................ 326/31–34, 62–63, 326/68, 80–83; 327/108–112

(56) References Cited

U.S. PATENT DOCUMENTS 5,751,166 A * 5/1998 Shieh et al. .................. 326/71
6,356,582 B1   3/2002 Mazer et al. ............... 375/219
2003/0016062 A1 * 1/2003 Ahsanullah et al. ........ 327/108

* cited by examiner

Primary Examiner—Anh Q. Tran
(74) Attorney, Agent, or Firm—Patent Law Group LLP; Carmen C. Cook

(57) ABSTRACT

A circuit receives a first supply voltage on a first terminal where the first supply voltage is used to supply circuitry within the circuit. The circuit includes an input terminal receiving a first signal and an input circuit coupled to the input terminal. The first signal has a logical high value at a second voltage and a logical low value at a third voltage. The second voltage is used to establish a switching threshold of at least some of the input and output signals of the circuit. The input circuit provides a reset signal to circuitry within the circuit causing the circuitry to reset. The reset signal is asserted when the first signal on the input terminal has a logical low value and the third voltage comprises a voltage below a predetermined trigger threshold of the input circuit.

12 Claims, 2 Drawing Sheets

//USPTO Patent US 6,903,569 B2

INPUT TERMINAL WITH COMBINED LOGIC THRESHOLD AND RESET FUNCTION

FIELD OF THE INVENTION

The invention relates to circuits receiving digital inputs and in particular, to a circuit including a multi-function input terminal providing a logic threshold and implementing a reset function.

DESCRIPTION OF THE RELATED ART

A universal serial bus transceiver capable of dual supply voltage operation is disclosed in U.S. Pat. No. 6,356,582 of Mazer et al., issued on Mar. 12, 2002 (hereinafter "the Mazer patent"), which patent is incorporated herein by reference in its entirety. FIG. 1 duplicates FIG. 3 of the Mazer patent and illustrates a universal serial bus (USB) transceiver 24 for interfacing between a USB controller (not shown) and a USB bus 18. USB transceiver 24 receives the supply voltage of the USB controller on a line 30 as a reference voltage $V_{IF}$. USB transceiver 24 also receives on line 18c the bus voltage $V_{BUS}$ of the USB bus for powering the internal circuitry of the transceiver. USB transceiver 24 uses the reference voltage $V_{IF}$ which is the supply voltage of the controller for setting the switching threshold of some of the input and output signals of the transceiver. In this manner, USB transceiver 24 can operate with USB controllers that are operating at supply voltages that are different from the bus voltage $V_{BUS}$ of the USB bus. The USB transceiver of the Mazer patent can thus be used with a variety of USB controllers utilizing different internal signal levels.

In digital circuits, there is generally a need to implement a reset function so that logical states of the core digital circuitry can be reset to known states when desired. Conventional digital integrated circuits typically use a dedicated reset pin to implement the reset function. However, as device sizes decreases, the number of pins that is available on an integrated circuit becomes more and more scarce. The number of available input/output pins on an integrated circuit often limits the amount of functions that can be implemented in a single integrated circuit.

SUMMARY OF THE INVENTION

According to one embodiment of the present invention, a circuit receives a first supply voltage on a first terminal where the first supply voltage is used to supply circuitry within the circuit. The circuit includes an input terminal receiving a first signal and an input circuit coupled to the input terminal. The first signal has a logical high value at a second voltage and a logical low value at a third voltage. The second voltage is used to establish a switching threshold of at least some of the input and output signals of the circuit. The input circuit provides a reset signal to circuitry within the circuit causing the circuitry to reset. The reset signal is asserted when the first signal on the input terminal has a logical low value and the third voltage comprises a voltage below a predetermined trigger threshold of the input circuit.

The present invention is better understood upon consideration of the detailed description below and the accompanying drawings.

DETAILED DESCRIPTION OF THE PREFERRED EMBODIMENTS

In accordance with the principles of the present invention, a circuit receives multiple supply voltages where a first supply voltage is used to supply power to the core circuitry while a second supply voltage is used to set the switching threshold of some of the input and output signals of the circuit. The circuit includes a multi-function input terminal coupled to receive a signal implementing an input threshold function and a reset function. Specifically, the signal has a logical high value at the second supply voltage and a logical low value indicating a reset operation. By implementing a multi-function input terminal, the circuit of the present invention can be provided with increased functionality without requiring an additional input/output pin.

Figure 1:
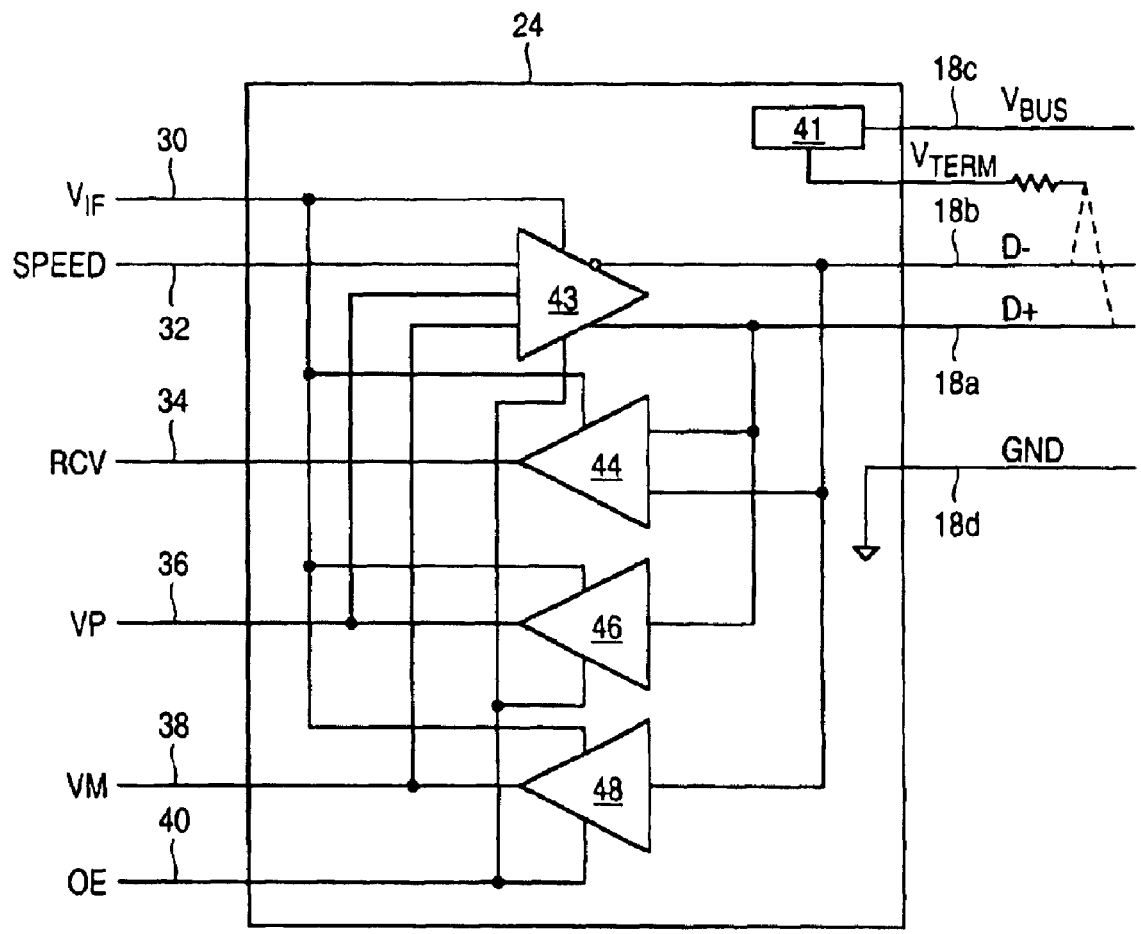
FIG. 1 duplicates FIG. 3 of U.S. Pat. No. 6,356,582 and illustrates a universal serial bus (USB) transceiver capable of dual supply voltage operation.
Figure 2:
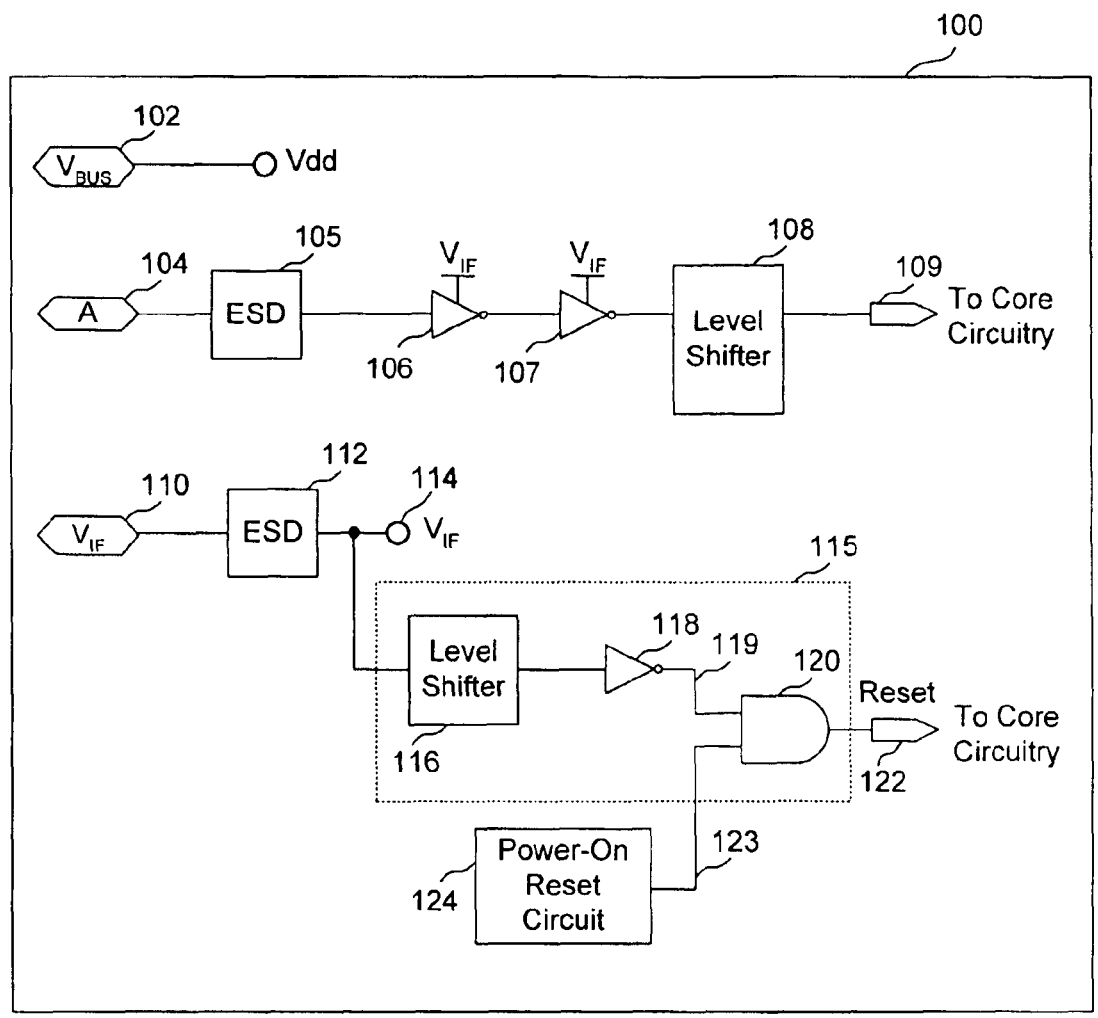
FIG. 2 is schematic diagram of a USB transceiver including a multi-function input terminal according to one embodiment of the present invention.

According to one embodiment of the present invention, the circuit including a multi-function input terminal is a USB transceiver constructed in accordance with the aforementioned Mazer patent. FIG. 2 is schematic diagram of a USB transceiver including a multi-function input terminal according to one embodiment of the present invention. FIG. 2 is a simplified schematic diagram of USB transceiver 100 and illustrates primarily the input/output circuitry of the USB transceiver. The core circuitry of the USB transceiver is not shown in FIG. 2. In one embodiment, the core circuitry can be implemented in accordance with the Mazer patent. The core circuitry for a USB transceiver is fully described in the Mazer patent and will not be repeated here.

USB transceiver 100 receives on an input terminal 102 a first supply voltage. In the present embodiment, the first supply voltage is the bus voltage $V_{BUS}$ of the USB bus to which USB transceiver 100 is coupled. The bus voltage $V_{BUS}$ is typically provided by another device on the USB bus, such as a host computer. The first supply voltage $V_{BUS}$ functions as the power supply voltage for the core circuitry of USB transceiver 100 and is also referred to as the supply voltage Vdd of the transceiver.

USB transceiver 100 also receives on an input terminal 110 a signal having a logical high value at a second supply voltage as a reference voltage $V_{IF}$. Reference voltage $V_{IF}$ is the power supply voltage of a USB controller to which USB transceiver 100 is coupled. The second supply voltage is used to establish the logic switching threshold of the input and output signals that are coupled between the transceiver and the USB controller. In this manner, the USB controller can be operated on a different power supply voltage than the bus voltage $V_{BUS}$.

Reference voltage $V_{IF}$, received on input terminal 110, is coupled to an electrostatic discharge (ESD) protection circuit 112 to protect the internal circuitry of transceiver 100 from high voltage conditions as a result of ESD events that may occur at the input terminal. The reference voltage $V_{IF}$ is available on a node 114 to be coupled to circuitry within transceiver 100 that uses the reference voltage $V_{IF}$. In the present illustration, ESD protection circuit 112 is shown as being connected in series between input terminal 110 and node 114. This configuration is illustrative only. In other embodiments, the ESD protection circuit can be connected to the input terminal and the ground potential or the input terminal and the Vdd potential of the transceiver. The exact configuration of the ESD protection circuit is not critical to the implementation of the multi-function input terminal of the present invention.

USB transceiver 100 receives on an input terminal 104 an input logic signal. The input logic signal can be a data signal such as a data signal from the USB controller corresponding to data signals D+ or D− of the USB bus. The input logic signal can also be the SPEED signal or the output enable OE signal provided to the transceiver from the USB controller. The input logic signal operates based on a logic threshold established by the supply voltage of the USB controller which is the same supply voltage that is coupled to transceiver 100 as reference voltage $V_{IF}$ as described above.

Input terminal 104 is coupled to an ESD protection circuit 105 and then to buffers 106 and 107. Buffers 106 and 107 are powered by reference voltage $V_{IF}$ and have a switching threshold compatible with that of the input logic signal. After buffering, the input logic signal is provided to a level shifter 108 which operates to shift the switching threshold of the input logic signal to a switching threshold based on the supply voltage of the core circuitry of the USB transceiver, that is, the Vdd voltage. The input logic signal on output node 109 of level shifter 108 can then be coupled to the core circuitry of transceiver 100 for further processing.

Input terminal 104 and associated circuitry represent one input terminal and associated circuitry that may be included in USB transceiver 100. USB transceiver 100 may include one or more input terminals 104 for receiving one or more input logic signals from an external device, such as the USB controller.

In accordance with the present invention, the signal received on input terminal 110 is used to implement the input threshold function and a reset function for USB transceiver 100. Thus, the reset function is implemented using an existing input terminal and the reset function can be implemented without increasing the pin count of USB transceiver 100. Because USB transceiver 100 is powered by the first supply voltage (voltage $V_{BUS}$) and the reference voltage $V_{IF}$ on input terminal 110 is used only as a reference voltage for setting the logic switching threshold of certain logic gates, the reference voltage $V_{IF}$ is not needed as a supply voltage for the core circuitry. Therefore, the same input terminal can be used to implement the reset function and the input threshold function.

Thus, in accordance with the present invention, when the signal on input terminal 110 is driven to a high logic value, the input terminal receives the reference voltage $V_{IF}$ which reference voltage is available on node 114 to supply power to designated logic circuits in USB transceiver 100. However, when a reset operation is desired, input terminal 110 is pulled low to cause the signal in the input terminal to transition to a low logical value.

To initiate a reset operation, input terminal 110 is pulled low. As a result, logic circuits supplied by reference voltage $V_{IF}$ will no longer function. However, the low signal on input terminal 110 is routed to a reset input circuit 115 for generating a reset signal for the core circuitry of the transceiver. Referring to FIG. 2, reset input circuit 115 includes a level shifter 116 coupled to an inverter 118. Level shifter 116 is optional and may be included to convert the signal on input terminal 110, having a switching threshold based on the reference voltage $V_{IF}$, to a switching threshold based on the Vdd voltage. However, level shifter 116 is not necessary as long as the voltage level of the reference voltage $V_{IF}$, when provided on input terminal 110, is sufficient to trigger inverter 118.

Inverter 118 is used primarily to provide a buffering function. In the present embodiment, the reset signal is an active high signal and thus an inverting buffering stage is used to convert the active low signal on input terminal 110 to an active high signal. In other embodiments, when the reset signal is an active low signal, a non-inverting buffer can be used in place of inverter 118. In the present embodiment, when input terminal 110 is pulled low, the high to low transition at the input terminal of inverter 118 results in a low to high transition at the output terminal (node 119) of inverter 118. The signal on node 119, referred herein as the "input reset signal," is then asserted and can be used as a reset signal for the core circuitry of USB transceiver 100.

In the present invention, the input reset signal is combined with a power-on reset signal to generate a Reset signal for the transceiver. The power-on reset signal is usually generated by a circuit, such as circuit 124, that is part of the core circuitry of USB transceiver 100. A power-on reset (POR) signal is provided to reset input circuit 115 on a node 123. Reset input circuit 115 includes an OR gate 120 coupled to perform a logical "OR" function of the input reset signal on node 119 and the POR signal on node 123. The resultant Reset signal on node 122 is then coupled to the core circuitry of USB transceiver 100 to instruct the core circuitry to reset. Thus, whenever one of the input reset signal or the POR signal is asserted, the Reset signal on node 122 will be asserted.

As mentioned above, the reset function in USB transceiver 100 can be operated while the transceiver is being powered by the first supply voltage. Thus, the reset operation can be initiated without powering down the transceiver. When USB transceiver 100 is powered down and then powered up, the POR rest signal will cause the core circuitry to reset.

In the present embodiment, OR gate 120 included in reset input circuit 115 to provide a Reset signal combining the input reset signal and the POR signal. In other embodiments, when the POR signal is not implemented, OR gate 120 can be omitted and the input reset signal on node 119 can be used as the final Reset signal. The configuration of input reset circuit 115 is illustrative only.

In the above descriptions, the present invention is described as being applied to a USB transceiver. This is illustrative only and the multi-function input terminal of the present invention can be applied to any circuit receiving two or more power supply voltages for implementing a reset function in the circuit. Specifically, the input terminal for one of the supply voltages can be configured as a multi-function input terminal providing a reset function when the input terminal is pulled low.

Furthermore, in the above descriptions, the reset function is implemented by pulling the voltage on input terminal 110 low. The exact voltage level to which the input terminal is pulled down to is not critical as long as the voltage on the input terminal is pulled below the trigger threshold of inverter 118. The trigger threshold of inverter 118 refers to the voltage level of the inverter at which the output signal changes logical state. When the voltage on input terminal 110 is pulled below the trigger threshold of inverter 118, the input reset signal on node 119 is asserted. To release the reset operation, input terminal 110 only needs to be pulled up to a voltage level that is greater than the trigger threshold of inverter 118. However, in actual implementation, since input terminal 110 is also used to receive reference voltage $V_{IF}$, the voltage on input terminal 110 is pulled up to reference voltage $V_{IF}$ when the reset operation is released.

The above detailed descriptions are provided to illustrate specific embodiments of the present invention and are not intended to be limiting. Numerous modifications and variations within the scope of the present invention are possible. For example, in the schematic diagram shown in FIG. 2, inverting buffers or inverters are used for the buffering stage. In other embodiments, non-inverting buffers can be used. The present invention is defined by the appended claims.

I claim:

1. A circuit receiving a first supply voltage on a first terminal, the first supply voltage being used to supply circuitry within the circuit, the circuit comprising:

an input terminal receiving a first signal, the first signal having a logical high value at a second voltage and a logical low value at a third voltage, the second voltage being used to establish a switching threshold of at least some of the input and output signals of the circuit; and an input circuit coupled to the input terminal, the input circuit providing a reset signal to circuitry within the circuit causing the circuitry to reset, wherein the reset signal is asserted when the first signal on the input terminal has a logical low value and the third voltage comprises a voltage below a predetermined trigger threshold of the input circuit.

2. The circuit of claim 1, wherein the input circuit comprises a buffer including an input terminal coupled to receive the first signal and an output terminal providing the reset signal and the predetermined trigger threshold comprises the trigger threshold of the buffer.

3. The circuit of claim 2, wherein the buffer comprises an inverting buffer.

4. The circuit of claim 1, wherein the input circuit comprises:

a level shifter coupled to receive the first signal and providing an output signal indicative of the logical state of the first signal and having a switching threshold based on the first supply voltage; and a buffer including an input terminal coupled to receive the output signal of the level shifter and an output terminal providing the reset signal, wherein the predetermined trigger threshold comprises the trigger threshold of the buffer.

5. The circuit of claim 4, wherein the buffer comprises an inverting buffer.

6. The circuit of claim 2, wherein the input circuit further comprises a logical OR gate having a first input terminal coupled to receive the output signal of the buffer and a second input terminal coupled to receive a power-on reset signal, the logical OR gate having an output terminal providing the reset signal.

7. A USB transceiver, comprising:

a first input terminal receiving a first supply voltage, the first supply voltage being used to supply circuitry within the transceiver;

a second input terminal receiving a first signal, the first signal having a logical high value at a second voltage and a logical low value at a third voltage, the second voltage being used to establish a switching threshold of at least some of the input and output signals of the transceiver; and an input circuit coupled to the second input terminal, the input circuit providing a reset signal to circuitry within the transceiver causing the circuitry to reset, wherein the reset signal is asserted when the first signal on the second input terminal has a logical low value and the third voltage comprises a voltage below a predetermined trigger threshold of the input circuit.

8. The USB transceiver of claim 7, wherein the input circuit comprises a buffer including an input terminal coupled to receive the first signal and an output terminal providing the reset signal and the predetermined trigger threshold comprises the trigger threshold of the buffer.

9. The USB transceiver of claim 8, wherein the buffer comprises an inverting buffer.

10. The USB transceiver of claim 7, wherein the input circuit comprises:

a level shifter coupled to receive the first signal and providing an output signal indicative of the logical state of the first signal and having a switching threshold based on the first supply voltage; and a buffer including an input terminal coupled to receive the output signal of the level shifter and an output terminal providing the reset signal, wherein the predetermined trigger threshold comprises the trigger threshold of the buffer.

11. The USB transceiver of claim 10, wherein the buffer comprises an inverting buffer.

12. The USB transceiver of claim 8, wherein the input circuit further comprises a logical OR gate having a first input terminal coupled to receive the output signal of the buffer and a second input terminal coupled to receive a power-on reset signal, the logical OR gate having an output terminal providing the reset signal.

* * * * *